(12) United States Patent
Ahn et al.

(10) Patent No.: US 10,170,731 B2
(45) Date of Patent: Jan. 1, 2019

(54) MASK AND MASKING ASSEMBLY

(71) Applicant: Point Engineering Co., Ltd., Asan-si, Chungcheongnam-do (KR)

(72) Inventors: Bum Mo Ahn, Suwon-si (KR); Seung Ho Park, Hwaseong-si (KR); Sung Hyun Byun, Hwaseong-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 15/491,351

(22) Filed: Apr. 19, 2017

(65) Prior Publication Data

US 2017/0309868 A1    Oct. 26, 2017

(30) Foreign Application Priority Data

Apr. 22, 2016  (KR) .................. 10-2016-0049146

(51) Int. Cl.
*H01L 51/00* (2006.01)
*H01L 51/50* (2006.01)
*H01L 51/56* (2006.01)

(52) U.S. Cl.
CPC .......... *H01L 51/56* (2013.01); *H01L 51/0011* (2013.01); *H01L 51/5012* (2013.01)

(58) Field of Classification Search
None
See application file for complete search history.

(56) References Cited

U.S. PATENT DOCUMENTS

| 5,165,991 | A | * | 11/1992 | Fukuda | G03G 5/02 428/195.1 |
| 5,177,398 | A | * | 1/1993 | Engemann | H01J 9/14 313/268 |
| 5,872,051 | A | * | 2/1999 | Fallon | B23K 1/0016 228/180.22 |
| 6,821,348 | B2 | * | 11/2004 | Baude | C23C 14/042 118/504 |
| 6,893,575 | B2 | * | 5/2005 | Yotsuya | C30B 33/00 216/12 |
| 6,897,164 | B2 | * | 5/2005 | Baude | C23C 14/042 438/780 |

(Continued)

FOREIGN PATENT DOCUMENTS

| JP | 05-043387 | 2/1993 | ............. C30B 23/04 |
| JP | H05-043387 | 2/1993 | ............. C30B 23/04 |

(Continued)

OTHER PUBLICATIONS

Korean Intellectual Patent Office, Office Action—Korean Application No. 10-2016-0049146, dated Apr. 3, 2017, 4 pages.

(Continued)

*Primary Examiner* — David E Graybill
(74) *Attorney, Agent, or Firm* — Sunstein Kann Murphy & Timbers LLP

(57) ABSTRACT

A mask for forming a pattern on a substrate is provided. The mask includes an anodic oxide film formed by anodizing metal, at least one transmission hole configured to vertically penetrate the anodic oxide film and formed in a corresponding relationship with the pattern, a plurality of pores formed in the anodic oxide film so as to have a smaller diameter than the transmission hole, and a magnetic material provided in each of the pores.

11 Claims, 8 Drawing Sheets

(56) References Cited

U.S. PATENT DOCUMENTS

| | | | | |
|---|---|---|---|---|
| 7,241,688 B2* | 7/2007 | Baude | ................. | C23C 14/042 257/E21.024 |
| 7,297,361 B2* | 11/2007 | Baude | ................. | C23C 14/042 427/248.1 |
| 9,103,921 B2* | 8/2015 | Torres | ................. | G01T 1/2002 |
| 2003/0150384 A1* | 8/2003 | Baude | ................. | C23C 14/042 118/721 |
| 2003/0152691 A1* | 8/2003 | Baude | ................. | C23C 14/042 427/96.8 |
| 2005/0042365 A1* | 2/2005 | Baude | ................. | C23C 14/042 427/96.1 |
| 2005/0051516 A1* | 3/2005 | Yotsuya | ................. | C30B 33/00 216/51 |
| 2006/0191864 A1* | 8/2006 | Yotsuya | ................ | C23C 14/042 216/41 |
| 2008/0044556 A1* | 2/2008 | Baude | ................. | C23C 14/042 427/96.1 |
| 2011/0239941 A1* | 10/2011 | Nakagawa | ............ | C23C 14/042 118/726 |
| 2016/0221017 A1* | 8/2016 | Huang | ................... | B29C 43/02 |
| 2017/0104158 A1* | 4/2017 | Kawato | .................. | C23C 14/12 |
| 2017/0244035 A1* | 8/2017 | Kawato | ............... | H01L 51/0011 |

FOREIGN PATENT DOCUMENTS

| | | | | |
|---|---|---|---|---|
| JP | H07-233464 | | 9/1995 | ............ C23C 14/04 |
| JP | 2000001392 A | * | 1/2000 | ............. H01J 9/025 |
| JP | 2008-255449 | | 10/2008 | ............. C23C 14/24 |
| KR | 10-2014-0106986 | | 9/2014 | ............. H01L 51/56 |

OTHER PUBLICATIONS

Korean Intellectual Patent Office, Office Action—Korean Application No. 10-2016-0049146, dated Apr. 3, 2017, 2 pages (English translation).

* cited by examiner (a)

MASK AND MASKING ASSEMBLY

CROSS-REFERENCE TO RELATED PATENT APPLICATION

This U.S. non-provisional patent application claims priority under 35 U.S.C. § 119 of Korean Patent Application No. 10-2016-0049146 filed on Apr. 22, 2016 in the Korean Patent Office, the entire contents of which are hereby incorporated by reference.

TECHNICAL FIELD

The present invention relates to a mask and a masking assembly. The mask of the present invention includes, but is not limited to, a mask for an organic light emitting diode used when forming a light emission layer of an organic light emitting diode.

BACKGROUND

An organic light emitting diode (OLED), which is one of flat plate displays, is a representative electronic element that makes use of a mask (shadow mask). In recent years, the organic light emitting diode is widely developed and used as a display for personal mobile communication such as a cellular phone or the like. The organic light emitting diode is extremely thin and has an advantage that the organic light emitting diode can be addressed in the form of a matrix and can be driven even at a low voltage of 15 V or less.

When manufacturing such an organic light emitting diode, a mask (shadow mask) is typically used in order to form an organic material deposition region and a second electrode. In particular, when manufacturing a full-color organic light emitting diode including RGB pixels, the regions of the respective RGB pixels are formed using a mask. Thus, it is a matter of course that the resolution of the mask is high. The alignment of a substrate and a mask serves as a very important factor that determines the image quality of an organic light emitting diode.

Conventionally, when manufacturing a mask for an organic light emitting diode, a photoresist (PR) is coated on a metal sheet. A pattern is formed by an exposure and development process using a photomask (or a pattern is directly formed by an exposure device without any mask). Thereafter, the pattern is transferred to the metal sheet by etching, thereby manufacturing a mask.

As a metal sheet for the manufacture of a mask, copper, nickel, stainless steel or the like may be used. However, invar, which is a nickel-iron alloy, is often used as the metal sheet. Invar has an extremely low thermal linear expansion coefficient (1 to $2 \times 10^{-6}/°$ C.) comparable to a thermal linear expansion coefficient ($3.20 \times 10^{-6}/°$ C.) of glass used as a substrate. Thus, the dimension of a mask with respect to a substrate is less likely to be changed by the influence of heat in a high-temperature deposition process. Accordingly, invar has an advantage in that it is possible to avoid misalignment between a deposition position at the time of registering a mask with a substrate and a deposition position of a deposition material at the time of high-temperature deposition.

However, invar has a problem in that a pattern cannot be easily formed by processing or etching. FIG. 1(A) is a sectional view showing a state in which the straightness of an inner wall of a transmission hole 10 formed at the time of etching is not secured and the inner width of the transmission hole 10 is not uniformly formed in an etching process for forming a pattern (d1≠d2). If depositing an organic light emitting material 20 as shown in FIG. 1(A), the organic light emitting material 20 is deposited on a substrate 30 in an actual deposition region 22 having a width d2 larger than a width d1 of a designed deposition region 24. The height of the organic light emitting material 20 is lower in the edge portion than in the central portion of the actual deposition region 22 having a width d2. Thus, there is generated a side effect that at the time of emitting light, the edge portion looks dimmer than the central portion. In this way, the mask made of invar has a limitation in that it is difficult to obtain a pattern having a resolution higher than a specific resolution.

SUMMARY

According to one aspect of the present invention, there is provided a mask for forming a pattern on a substrate, including: an anodic oxide film formed by anodizing metal; at least one transmission hole configured to vertically penetrate the anodic oxide film and formed in a corresponding relationship with the pattern; a plurality of pores formed in the anodic oxide film so as to have a smaller diameter than the transmission hole; and a magnetic material provided in each of the pores.

In the mask, the anodic oxide film may include a barrier layer configured to close one end of each of the pores, and at least a portion of the magnetic material may be provided in a bottom of each of the pores.

In the mask, the transmission hole may have a diameter which is uniform in a vertical direction.

In the mask, the magnetic material may be made of nickel.

In the mask, the pattern may be formed by depositing an organic light emitting material on the substrate covered with the mask.

According to another aspect of the present disclosure, there is provided a masking assembly for forming a pattern on a substrate, including: a mask; and a magnetic plate configured to bring the mask into close contact with the substrate, wherein the mask includes an anodic oxide film formed by anodizing metal, at least one transmission hole configured to vertically penetrate the anodic oxide film and formed in a corresponding relationship with the pattern, a plurality of pores formed in the anodic oxide film so as to have a smaller diameter than the transmission hole, and a magnetic material provided in each of the pores, and wherein the magnetic plate and the magnetic material have such a magnetic property that when the substrate is interposed between the mask and the magnetic plate, the substrate is pressed against the mask by a magnetic force generated between the magnetic material and the magnetic plate.

In the masking assembly, the anodic oxide film may include a barrier layer configured to close one end of each of the pores, and at least a portion of the magnetic material may be provided in a bottom of each of the pores.

In the masking assembly, the transmission hole may have a diameter which is uniform in a vertical direction.

In the masking assembly, the magnetic material may be made of nickel.

In the masking assembly, the pattern may be formed by depositing an organic light emitting material on the substrate covered with the mask.

According to embodiments of the present invention, the following effects may be achieved.

A high-resolution pattern can be easily obtained using an anodic oxide film formed by anodizing metal.

An anodic oxide film alone can be brought into contact with a substrate without having to be supported by a separate magnetic member. It is therefore easy to use the anodic oxide film.

DETAILED DESCRIPTION

Figure 1:
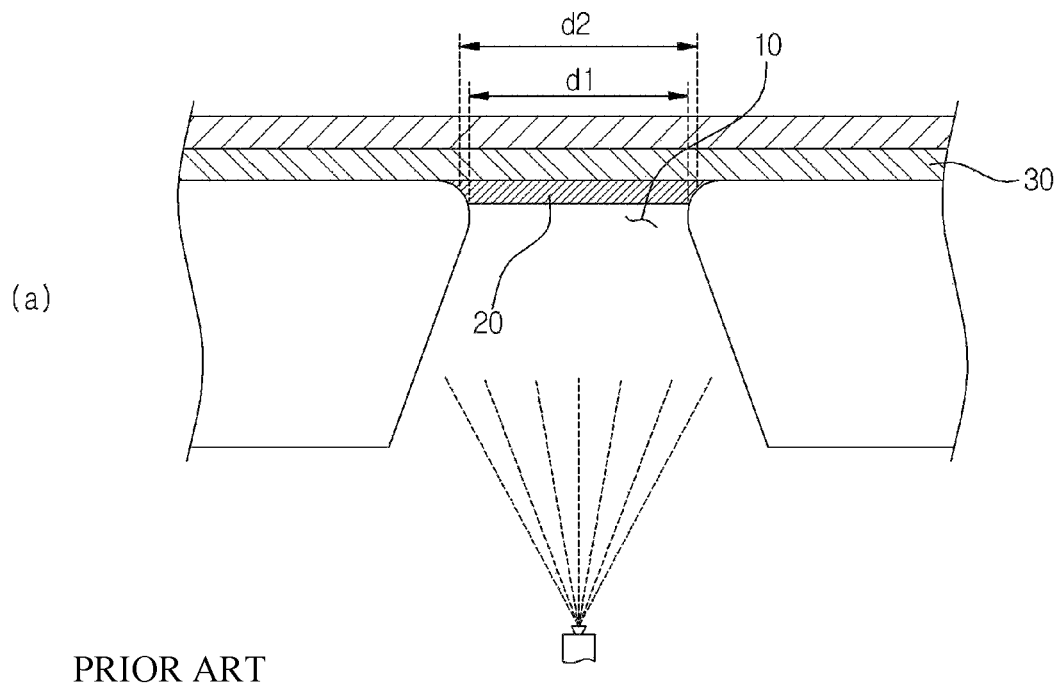
FIG. 1(A) is an enlarged sectional view showing a transmission hole region of a conventional mask for an organic light emitting diode.
FIG. 1(B) is an enlarged plan view of an organic light emitting diode obtained by depositing an organic light emitting material using a conventional mask for an organic light emitting diode.
Figure 1:
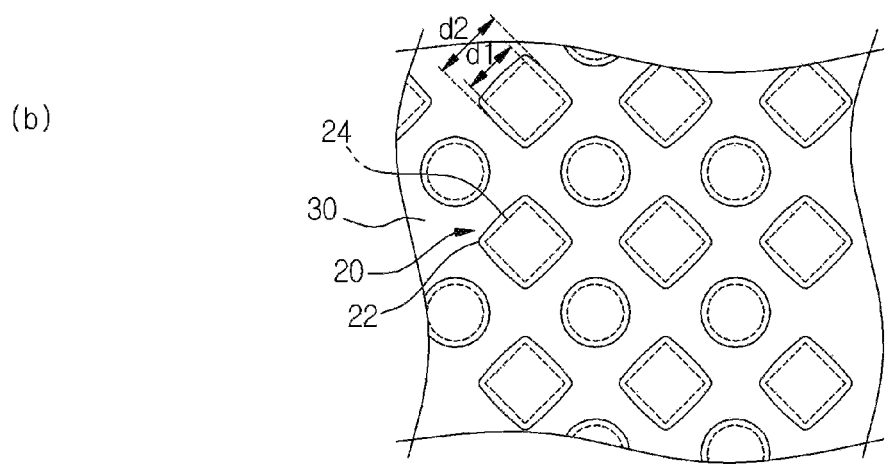

Preferred embodiments of the present invention will now be described in detail with reference to the accompanying drawings. The advantages, features and methods for achieving the same will become apparent from the following description of preferred embodiments given in conjunction with the accompanying drawings. However, the present invention is not limited to the embodiments described herein but may be embodied in many different forms. Rather, the embodiments disclosed herein are provided in order to ensure that the disclosure is thorough and to ensure that the concept of the present invention is sufficiently delivered to a person having an ordinary knowledge in the relevant art. The terms used herein are presented for the description of the embodiments but are not intended to limit the present invention. In the subject specification, a singular form includes a plural form unless specifically mentioned otherwise. By the term "comprises" or "comprising" used herein, it is meant that a component, a step, an operation or an element referred to herein does not exclude existence or addition of one or more other components, steps, operations or elements. Furthermore, the reference symbols presented in the order of descriptions is not necessarily limited to the specified order.

The embodiments disclosed herein will be described with reference to the accompanying drawings. In the drawings, the thickness of a layer and a region is exaggerated to effectively describe the technical contents. Thus, the form of exemplary views may be changed depending on a manufacturing technique and/or a tolerance. For that reason, the embodiments of the present invention are not limited to specific forms illustrated in the drawings but may include changes in form generated depending on a manufacturing process. Accordingly, the regions illustrated in the drawings have general attributes. The shapes of the regions illustrated in the drawings merely illustrate specific forms of element regions and do not limit the scope of the invention.

When describing different embodiments, for the sake of convenience, components having the same function will be given the same name and the same reference numeral even if the components are included in different embodiments. In addition, for the sake of convenience, the configuration and operation described in one embodiment will be omitted in another embodiment.

Referring to FIGS. 2 to 8, a mask 101 for an organic light emitting diode according to a preferred embodiment of the present invention is formed of an anodic oxide film obtained by anodizing metal. The mask 101 includes: a plurality of regularly-arranged pores 112; a transmission hole 114 vertically extending through the anodic oxide film so that an organic light emitting material is supplied through the transmission hole 114 and deposited on a substrate 200; and a magnetic material 113 disposed inside the pores 112.

Hereinafter, the mask 101 for an organic light emitting diode will be referred to as mask 101.

First, description will be made on a deposition apparatus 100 in which the mask 101 is installed. Then, the mask 101 will be described in detail.

Figure 2:
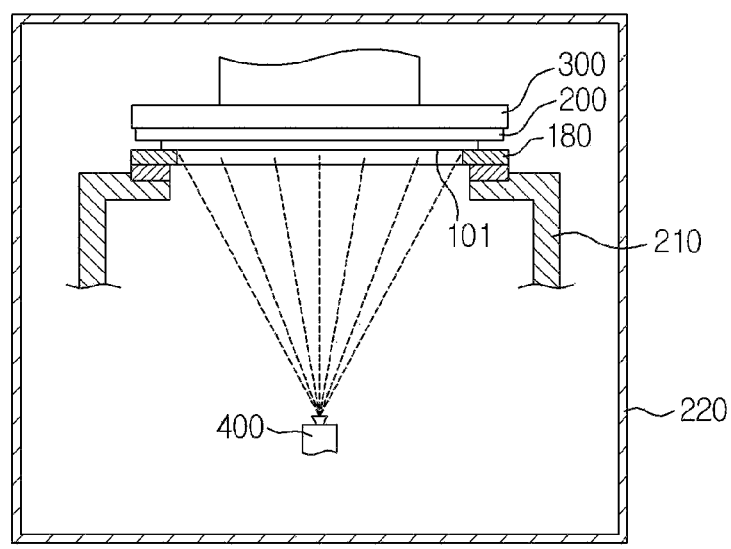
FIG. 2 is a sectional view showing a deposition apparatus for an organic light emitting diode according to a preferred embodiment of the present invention.

As shown in FIG. 2, the deposition apparatus 100 for an organic light emitting diode includes an organic light emitting material source 400 configured to supply an organic light emitting material to the substrate 200, a mask 101 positioned between the substrate 200 and the organic light emitting material source 400, and a fixing means 300 positioned above the substrate 200 and configured to bring the mask 101 into close contact with the substrate 200. The fixing means 300 may be preferably a magnet or a magnetic plate.

The upper surface of the mask 101 is opposed to and brought into contact with the substrate 200.

As shown in FIG. 2, the deposition apparatus 100 for an organic light emitting diode includes a vacuum chamber 220, a mounting table 210 disposed inside the vacuum chamber 220, and a frame 180 installed on the mounting table 210 and configured to hold the mask 101.

The organic light emitting material supplied from the organic light emitting material source 400 is supplied through the mask 101, specifically the transmission hole 114 of the mask 101, and is deposited on the lower surface of the substrate 200.

Hereinafter, the mask 101 and the frame 180 holding the mask 101 will be described in detail with reference to FIGS. 3 to 8.

Figure 3:
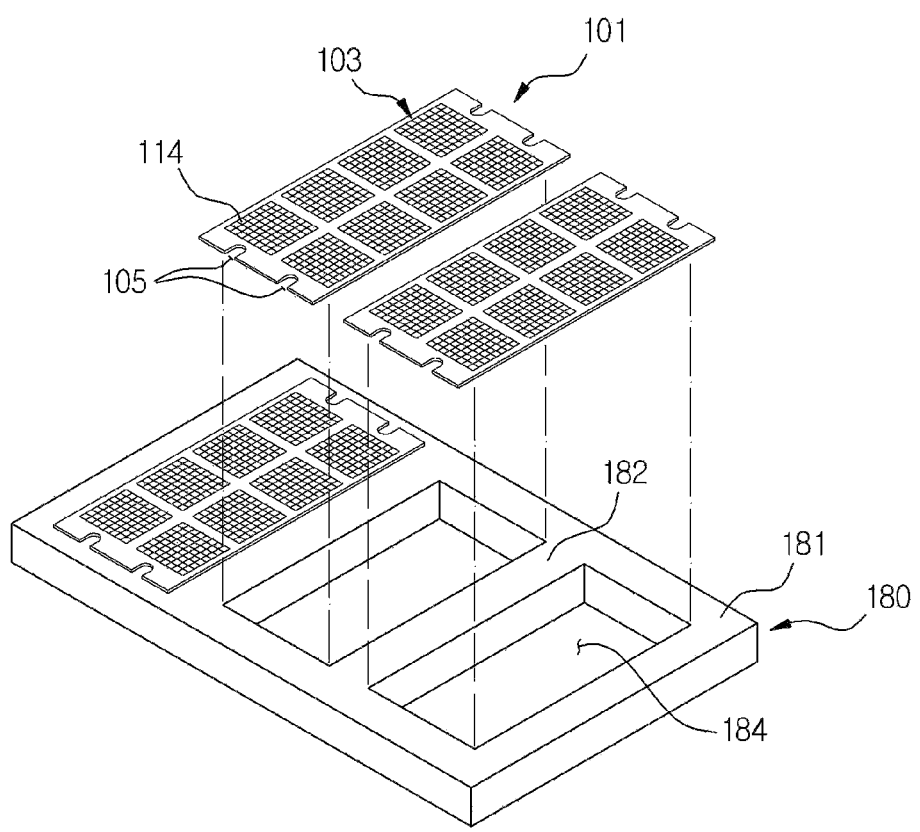
FIG. 3 is a perspective view of a mask and a frame for an organic light emitting diode according to a preferred embodiment of the present invention.

As shown in FIG. 3, the frame 180 holding the mask 101 includes a rectangular rim 181 and a plurality of spaced-apart parallel beams 182 disposed inside the rim 181.

The rim 181 is formed to have a hollow interior. The beams 182 are disposed in the hollow interior of the rim 181 so as to define a plurality of spaces 184 inside the rim 181.

As shown in FIG. 3, the mask 101 is placed on and fixed to the frame 180. More specifically, the mask 101 is placed on the rim 181 and beams 182 and is fixed thereto by welding or the like. A plurality of grooves 105 may be symmetrically formed in the opposite edges of the mask 101.

As shown in FIG. 3, the mask 101 is formed in a rectangular plate shape so as to have a smaller area than the frame 180. A plurality of masks 101 may be fixed side by side to the upper surface of the frame 180.

Figure 4:
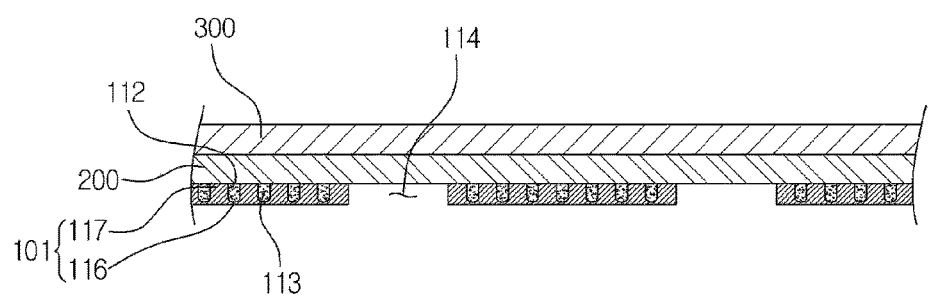
FIG. 4 is a partially enlarged sectional view of one unit masking pattern portion in a state in which a mask for an organic light emitting diode, a substrate and a fixing means are laminated one above another.

As shown in FIGS. 3 and 4, a plurality of unit masking pattern portions 103 is formed in the mask 101. Each of the unit masking pattern portions 103 has a plurality of transmission holes 114 formed so as to penetrate the unit masking pattern portion 103.

FIG. 4 is a partially enlarged sectional view showing one unit masking pattern portion 103 in a state in which the mask 101, the substrate 200 and the fixing means 300 are laminated one above another as shown in FIG. 2.

As shown in FIG. 4, the substrate 200 is positioned so as to make contact with the upper surface of the mask 101. The fixing means 300 for bringing the mask 101 into close contact with the substrate 200 is positioned on the substrate 200. The fixing means 300 may be preferably a magnet or a magnetic plate.

Figure 5:
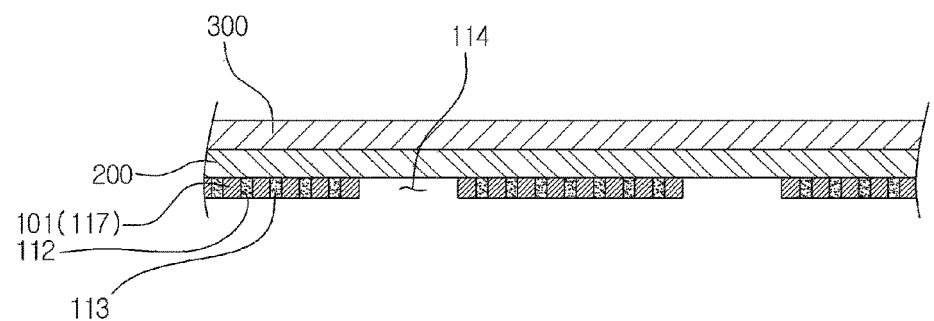
FIG. 5 is a partially enlarged sectional view showing a modification of the unit masking pattern portion shown in FIG. 4.

As shown in FIGS. 4 and 5, the mask 101 may be formed of an anodic oxide film obtained by anodizing metal. The mask 101 has a plurality of regularly-disposed pores 112. The transmission hole 114 having a larger inner width than the pores 112 is formed so as to penetrate the mask 101.

The mask 101 is formed by anodizing metal and then removing the metal as a base material. As shown in FIG. 4, at least a portion of the mask 101 may be formed of a porous anodic oxide film including a barrier layer 116 and a porous layer 117. More specifically, the mask 101 may include a porous layer 117 having pores 112 and a barrier layer 116 formed under the porous layer 117 so as to close one ends of the pores 112. The upper ends of the pores 112 are formed so as to penetrate the upper surface of the mask 101, namely the upper surface of the porous layer 117. In addition, the lower ends of the pores 112 are closed by the barrier layer 116.

The inner width of the pores 112 formed in the mask 101 may be in a range of several nanometers (nm) to 300 nm. The cross section taken in a direction orthogonal to the longitudinal direction of the pores 112 has a circular shape.

In particular, the metal as a base material of the mask 101 is nonmagnetic and may include aluminum. The mask 101 may be preferably an anodic aluminum oxide film formed by anodizing aluminum.

Figure 6:
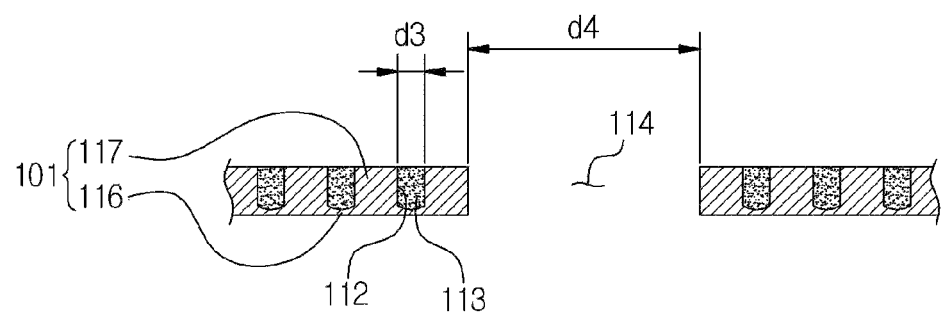
FIG. 6 is an enlarged sectional view of a transmission hole region shown in FIG. 4.
Figure 7:
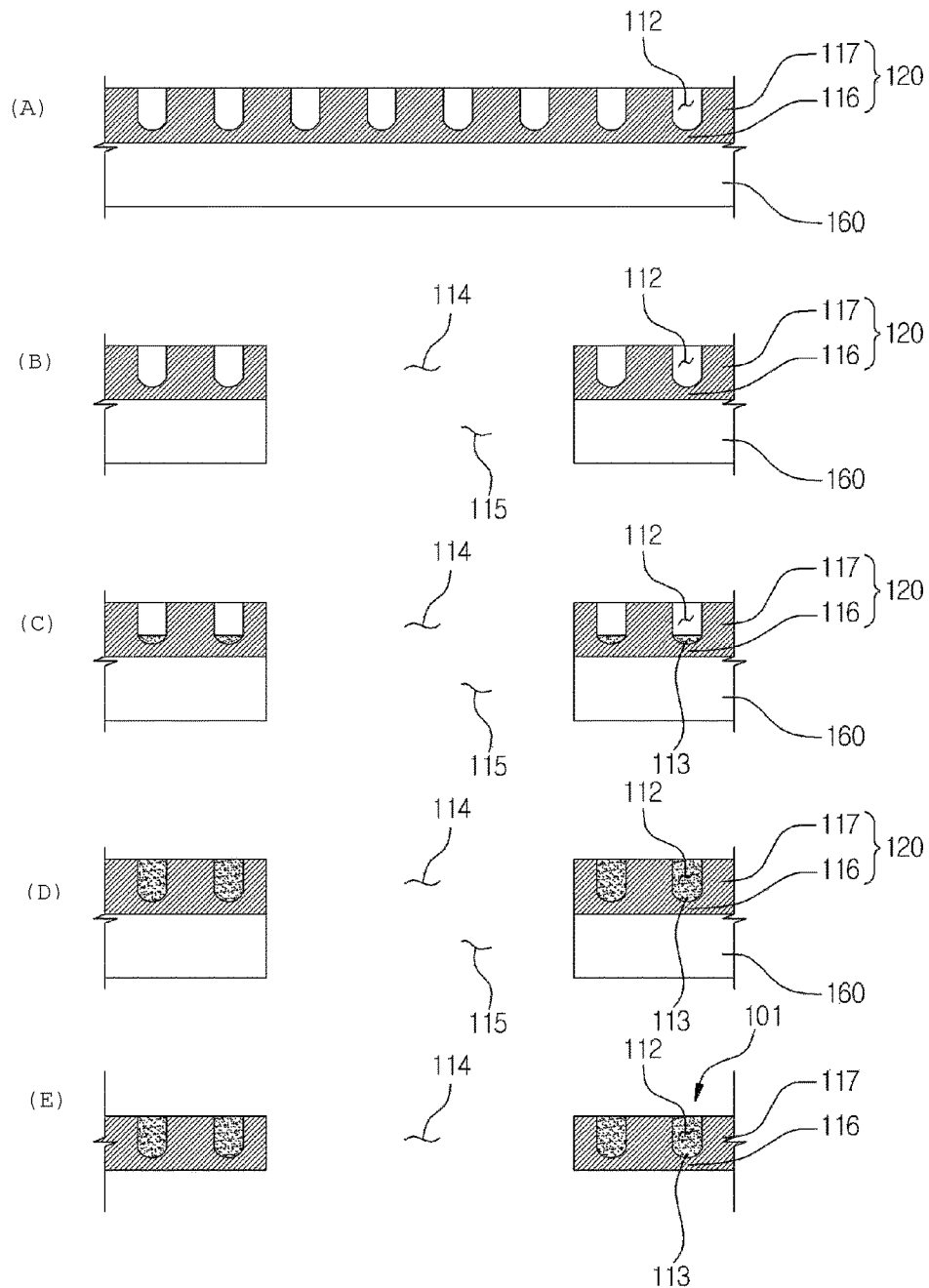
FIGS. 7(A) to 7(E) are sectional views showing a manufacturing sequence of a mask for an organic light emitting diode.
Figure 8:
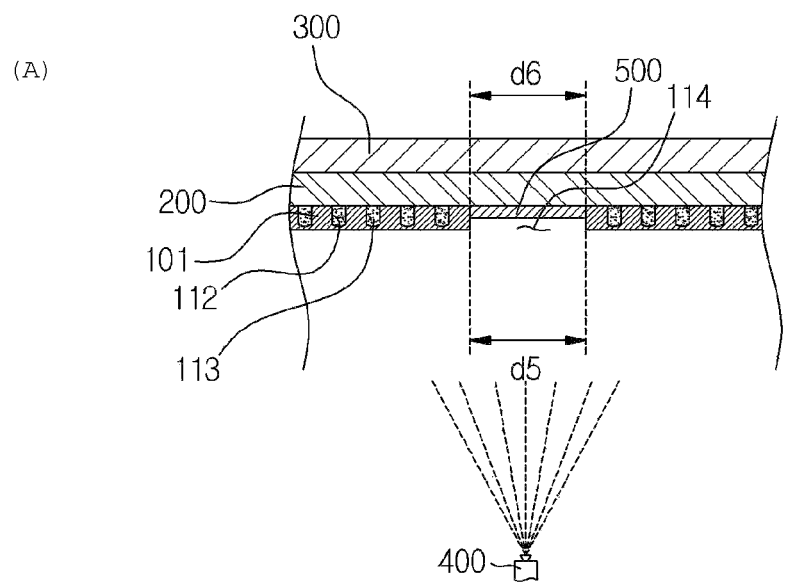
FIG. 8(A) is an enlarged sectional view showing a state in which an organic light emitting material is deposited on the unit masking pattern portion shown in FIG. 4.
FIG. 8(B) is an enlarged plan view of an organic light emitting diode.
Figure 8:
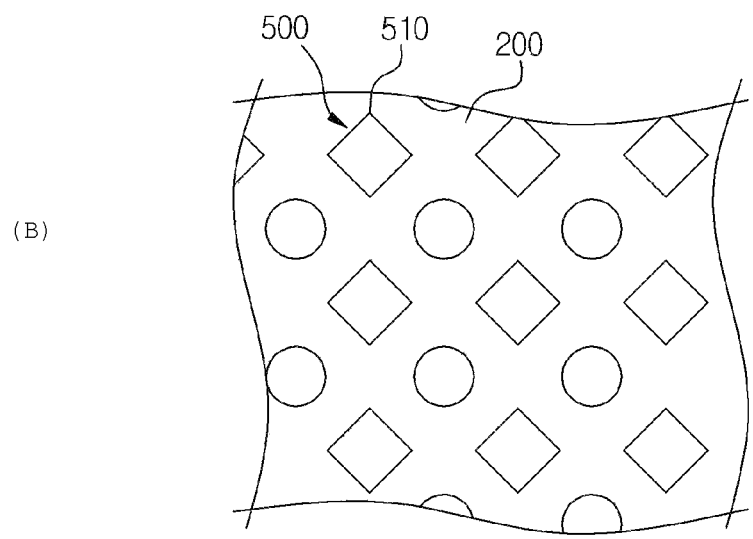

As shown in FIGS. 4 to 6, a magnetic material 113 is disposed inside each of the pores 112. More specifically, the magnetic material 113 may be formed by plating magnetic metal inside each of the pores 112. The magnetic material 113 may be preferably made of nickel.

As shown in FIGS. 4 and 6, when the mask 101 includes the barrier layer 116, at least a portion of the magnetic material 113 is formed on the inner bottom of each of the pores 112. The lower portion of the magnetic material 113, namely the portion of the magnetic material 113 positioned on the inner lower side of each of the pores 112 and located adjacent to the barrier layer 116, may be formed by electroplating (AC plating).

In the case of using electroless plating, there is a problem in that plating is weakly performed on the inner lower portion (or the bottom portion) of each of the pores 112 adjacent to the barrier layer 116. This problem can be solved through the use of electroplating (AC plating).

The portions of the magnetic material 113 positioned in the central and upper regions of each of the pores 112 may be formed by electroless plating or electroplating (AC plating).

The vertical length of each of the pores 112 may be further increased by removing the portion of the barrier layer 116 positioned below each of the pores 112. Nickel as the magnetic material 113 is plated inside each of the pores 112.

The magnetic material 113 has a magnetic property and tends to be pulled toward the substrate 200 by the magnetic force of the fixing means 300 which is a magnet or a magnetic plate. Thus, the magnetic material 113 serves to bring the mask 101 into close contact with the substrate 200. That is to say, the mask 101 formed of an anodic oxide film is easily and independently brought into contact with the substrate 200 by the magnetic material 113 without having to be supported by a separate magnetic member.

Conventionally, invar having a magnetic property and a low thermal linear expansion coefficient has been used in order to bring the mask 101 into close contact with the substrate 200. However, invar has a problem in that the use of invar makes it difficult to form a pattern through processing or etching.

An anodic oxide film obtained by anodizing aluminum has an extremely low thermal linear expansion coefficient of about $1.8 \times 10^{-6}$/° C. Thus, the mask 101 may be formed only by the anodic oxide film without having to be supported by a separate member having a low thermal linear expansion coefficient. In other words, the mask 101 thus formed is less likely to undergo a change in dimension due to the influence of heat. Therefore, even if the mask 101 is formed of only the anodic oxide film without having to be supported by a separate member such as an invar member or the like, it is possible to avoid a shift of a deposition position of a deposition material at the time of deposition under a high-temperature environment.

As in a modification shown in FIG. 5, the mask 101 may be an anodic oxide film formed of only a porous layer 117 having a plurality of pores 112. In other words, the mask 101 may be formed by anodizing metal and then removing not only the metal but also the barrier layer 116. Thus, the pores 112 of the mask 101 shown in FIG. 5 vertically penetrate the mask 101. That is to say, the pores 112 are formed so as to penetrate the upper surface and the lower surface of the mask 101. A plurality of pores 112 extending in the vertical direction is formed in the mask 101. A magnetic material 113 is formed inside each of the pores 112 so as to extend from the upper end of the mask 101 to the lower end thereof.

In the meantime, a plurality of transmission holes 114 is formed so as to penetrate the upper surface and the lower surface of the mask 101. In the example shown in FIG. 4, the transmission holes 114 are formed so as to penetrate both the porous layer 117 and the barrier layer 116. In the modification shown in FIG. 5, the transmission holes 114 are formed so as to penetrate the porous layer 117. That is to say, the transmission holes 114 are vertically formed so as to completely penetrate the mask 101 which is an anodic oxide film.

As shown in FIG. 6, the inner width of the transmission holes 114 is larger than the inner width of the pores 112 ($d3<d4$). As shown in FIG. 4, the pores 112 may be positioned between the spaced-apart transmission holes 114. The cross section taken along a direction orthogonal to the longitudinal direction of the transmission holes 114 may have a circular shape, an elliptical shape or a polygonal shape.

Furthermore, the transmission holes 114 have a constant inner width from the upper surface to the lower surface of the mask 101. In other words, the inner width of the transmission holes 114 is constant from the upper end to the lower end of each of the transmission holes 114. The organic light emitting material supplied from the organic light emitting material source 400 is moved through each of the transmission holes 114 and is deposited on the substrate 200. RGB (red-green-blue) materials are used as the organic light emitting material.

Hereinafter, a method for manufacturing the mask 101 using an anodic oxide film will be described with reference to FIGS. 7(A) to 7(E).

In a first step, as shown in FIG. 7(A), an aluminum plate 160 is anodized to form a porous anodic oxide film 120 including a barrier layer 116 and a porous layer 117 on one surface thereof.

In a second step, as shown in FIG. 7(B), etching is performed so that the porous anodic oxide film 120 and the aluminum plate 160 are vertically pierced. That is to say, a transmission hole 114 is formed by etching the porous anodic oxide film 120, and a through-hole 115 is formed by etching the aluminum plate 160. The transmission hole 114 and the through-hole 115 may be individually formed by using different etching solutions with respect to the porous anodic oxide film 120 and the aluminum plate 160. The transmission hole 114 and the through-hole 115 are in communication with each other.

In a third step, as shown in FIG. 7(C), a magnetic material 113 is formed by electroplating (AC plating) metal such as nickel or the like in the inner lower region of each of the pores 116 adjacent to the barrier layer 116.

In a fourth step, as shown in FIG. 7(D), the magnetic material 113 is made larger by electroless plating metal such as nickel or the like in the inner central and upper regions of each of the pores 112 after the aforementioned third step. In the fourth step, just like the third step, metal may be plated by electroplating (AC plating)

In a fifth step, as shown in FIG. 7(E), the aluminum plate 160 is removed to obtain a mask 101. While the barrier layer 116 is left in the example shown in FIG. 7(E), it may be possible to remove the barrier layer 116 when removing the aluminum plate 160.

According to the mask 101 formed of the anodic oxide film as described above, it is possible to secure the straightness of the inner wall of the transmission hole 114, namely the uniform inner width of the transmission hole 114 through the etching. This makes it possible to easily obtain a high-resolution pattern for use in depositing the organic light emitting material on the substrate 200.

As shown in FIG. 8(A), an organic light emitting material 500 is deposited on the substrate 200 using the mask 101 including the transmission hole 114 having a uniform inner width. In this case, unlike the prior art shown in FIG. 1, a deposition region 510 obtained by depositing the organic light emitting material 500 on the substrate 200 is formed at a uniform thickness from the edge to the center thereof. Moreover, it is possible to increase the matching degree between the edge of the deposition region 510 (having a width of d6) actually deposited on the substrate 200 and the edge of a designed deposition region having a width d5. In addition, when the edge of the deposition region 510 is defined as a polygonal edge, it is possible to form the polygonal edge as designed.

Owing to the advantages mentioned above, the organic light emitting material 500 is accurately patterned in conformity with the designed deposition region 510. There is not generated a side effect that the edge portion of the deposition region 510 looks dimmer than the central portion thereof. It is therefore possible to obtain a high-resolution organic light emitting diode.

In the case of invar frequently used in the prior art, when a pattern is formed by etching, an undercut or the like is generated on the inner wall of the transmission hole 10 as shown in FIG. 1(A). Thus, there is a problem in that it is impossible to obtain a transmission hole 10 having a uniform inner width (d1≠d2). For that reason, as shown in FIG. 1(B), the organic light emitting material 20 is deposited on the substrate 200 so that the actual deposition region 20 has a width d2 larger than the width d1 of the designed deposition region 24. Moreover, when the edge of the deposition region of the organic light emitting material 20 is defined as a polygonal edge, the deposition region is not formed in a polygonal shape but is formed in a curvilinear shape. In the actual deposition region 22 having a width d2, the height of the organic light emitting material 20 is smaller in the edge portion than in the central portion. Thus, there is generated a side effect that when light is emitted, the edge portion looks dimmer than the central portion. However, according to embodiments of the present invention a pattern can be accurately formed through etching by using the anodic oxide film as the mask 101.

As shown in FIG. 8(B), the organic light emitting diode manufactured using the mask 101 for an organic light emitting diode described above includes a substrate 200 and an organic light emitting material 500 deposited on the substrate 200 in a deposition region 510. The deposition region 510 is defined by a polygonal edge. The polygonal edge has angulate corners. Alternatively, the deposition region 510 may have a circular shape or an elliptical shape.

The deposition region 510 of the organic light emitting material 500 is formed to have a uniform height from the edge portion to the central portion thereof. It is therefore possible to obtain high-resolution performance without generating a side effect that the edge portion looks dimmer than the central portion.

In the meantime, a method for manufacturing the organic light emitting diode described above include: a step of preparing a substrate 200; a step of disposing a mask 101 on the substrate 200, the mask 101 formed of an anodic oxide film obtained by anodizing metal, the mask 101 including a transmission hole 114 vertically penetrating the anodic oxide film, a plurality of pores 112 and a magnetic material 113 formed inside each of the pores 112; and a step of supplying an organic light emitting material 500 through the transmission hole 114 so as to be deposited on the substrate 200.

The organic light emitting diode is manufactured inside the deposition apparatus 100 for an organic light emitting diode shown in FIG. 2.

The substrate 200 is prepared inside the vacuum chamber 220. The frame 180 holding the mask 101 is placed and installed on the mounting table 210. The mask 101 is disposed on the substrate 200 on which the organic light emitting material 500 (not shown in FIG. 2) is to be deposited. The reason for disposing the mask 101 on the substrate 200 is to deposit the organic light emitting material 500 on the substrate 200 in a specified pattern. Thereafter, the organic light emitting material 500 is supplied from the organic light emitting material source 400 existing under the mask 101 and is deposited on the substrate 200 through the transmission hole 114 (not shown in FIG. 2) in a specified pattern, thereby obtaining an organic light emitting diode.

While the mask for an organic light emitting diode and the masking assembly for an organic light emitting diode have been described above, the mask and the masking assembly according to the present invention may be applied not only to the manufacture of an organic light emitting diode but also to a case where a pattern is deposited on a substrate.

While preferred embodiments of the present invention have been described above, a person skilled in the relevant technical field will be able to diversely change or modify the embodiments without departing from the spirit and scope of the present invention defined in the claims.

What is claimed is:

1. A mask for forming a pattern on a substrate, comprising:
    an anodic oxide film formed by anodizing metal;
    at least one transmission hole configured to vertically penetrate the anodic oxide film and formed in a corresponding relationship with the pattern, the at least one transmission hole having a diameter;
    a plurality of pores formed in the anodic oxide film so as to have a smaller diameter than the at least one transmission hole; and
    a magnetic material provided in each of the pores such that each of the pores is at least partially filled with the magnetic material.

2. The mask of claim 1, wherein the anodic oxide film includes a porous layer and a barrier layer.

3. The mask of claim 1, wherein the diameter of the at least one transmission hole is uniform in a vertical direction.

4. The mask of claim 1, wherein the magnetic material is made of nickel.

5. The mask of claim 1, wherein the pattern is formed by depositing an organic light emitting material on the substrate covered with the mask.

6. A masking assembly for forming a pattern on a substrate, comprising:
    a mask; and
    a magnetic plate configured to bring the mask into close contact with the substrate, wherein the mask includes an anodic oxide film formed by anodizing metal, at least one transmission hole configured to vertically penetrate the anodic oxide film and formed in a corresponding relationship with the pattern and having a diameter, a plurality of pores formed in the anodic oxide film so as to have a smaller diameter than the at least one transmission hole, and a magnetic material provided in each of the pores such that each of the pores is at least partially filled with the magnetic material,
    wherein the magnetic plate and the magnetic material have such a magnetic property that an attractive force is generated between the magnetic plate and the magnetic material.

7. The masking assembly of claim 6, wherein the anodic oxide film includes a porous layer and a barrier layer.

8. The masking assembly of claim 6, wherein the anodic oxide film includes a barrier layer configured to close one end of each of the pores.

9. The masking assembly of claim 6, wherein the diameter of the at least one transmission hole is uniform in a vertical direction.

10. The masking assembly of claim 6, wherein the magnetic material is made of nickel.

11. The masking assembly of claim 6, wherein the pattern is formed by depositing an organic light emitting material on the substrate covered with the mask.

* * * * *